(12) United States Patent
Summers et al.

(10) Patent No.: US 9,537,020 B2
(45) Date of Patent: Jan. 3, 2017

(54) SOLAR CELL ELECTRODE

(71) Applicant: E I DU PONT DE NEMOURS AND COMPANY, Wilmington, DE (US)

(72) Inventors: John Donald Summers, Chapel Hill, NC (US); Hikaru Uno, Kanagawa (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/755,655

(22) Filed: Jun. 30, 2015

(65) Prior Publication Data

US 2016/0005889 A1    Jan. 7, 2016

Related U.S. Application Data

(60) Provisional application No. 62/020,256, filed on Jul. 2, 2014.

(51) Int. Cl.
| | | |
|---|---|---|
| *H01L 21/00* | (2006.01) | |
| *H01L 31/0224* | (2006.01) | |
| *C09D 5/24* | (2006.01) | |
| *H01B 1/22* | (2006.01) | |

(52) U.S. Cl.
CPC ......... *H01L 31/022425* (2013.01); *C09D 5/24* (2013.01); *H01B 1/22* (2013.01); *Y02E 10/50* (2013.01)

(58) Field of Classification Search
CPC .............. H01L 31/18; H01B 1/20; C09D 5/24
USPC .............................................. 438/57; 136/256
See application file for complete search history.

(56) References Cited

U.S. PATENT DOCUMENTS

| | | | | |
|---|---|---|---|---|
| 8,389,324 B2* | 3/2013 | Konno | ..................... | H01B 1/22 257/E21.159 |
| 2006/0293458 A1* | 12/2006 | Chung | ................ | B29C 47/0004 525/192 |
| 2008/0269387 A1* | 10/2008 | Resendes | .............. | B60C 1/0016 524/186 |
| 2008/0302411 A1* | 12/2008 | Nakahara | ................. | H01B 1/22 136/252 |
| 2011/0151614 A1* | 6/2011 | Lochtman | ......... | H01L 31/02242 438/98 |
| 2012/0132274 A1* | 5/2012 | Kleine Jaeger | ... | H01L 31/02242 136/256 |
| 2013/0011959 A1* | 1/2013 | Konno | ..................... | H01B 1/22 438/98 |
| 2014/0000682 A1* | 1/2014 | Zhao | ................... | H01L 31/0481 136/251 |

OTHER PUBLICATIONS

International Search Report Dated Sep. 21, 2015 for International Patent Application No. PCT/US2015/038461.

* cited by examiner

*Primary Examiner* — Tuan Nguyen

(57) ABSTRACT

A method of manufacturing a solar cell electrode comprising steps of: preparing a semiconductor substrate, applying a conductive paste onto the light receiving side of the semiconductor substrate, wherein the conductive paste comprises (i) a conductive powder, (ii) a glass frit, (iii) an organic polymer comprising an elastomer and (iv) an organic solvent; and firing the applied conductive paste.

19 Claims, 1 Drawing Sheet

SOLAR CELL ELECTRODE

FIELD OF THE INVENTION

The invention relates to a solar cell electrode, more specifically to a conductive paste used to form a solar cell electrode and a method of manufacturing a solar cell electrode.

TECHNICAL BACKGROUND OF THE INVENTION

Solar cell electrodes formed on the front light-receiving side of a crystalline silicon wafer of a photovoltaic cell reduce the amount of light reaching the wafer. It is desirable to form fine electrode lines on the front side of the silicon wafer in order to enlarge the light receiving area.

US2013011959 discloses a method of manufacturing a solar cell electrode comprising steps of: applying onto a semiconductor substrate a conductive paste comprising (i) a conductive powder, (ii) a glass frit, (di) ethyl cellulose as an organic polymer and (iv) an organic solvent comprising 30 to 85 weight percent (wt %) of 1-phenoxy-2-propanol based on the weight of the organic solvent; and firing the conductive paste.

SUMMARY OF THE INVENTION

An objective is to provide a method of manufacturing a solar cell electrode with a conductive paste to form a fine line electrode.

An aspect relates to a method of manufacturing a solar cell electrode comprising steps of: preparing a semiconductor substrate, applying a conductive paste onto the light receiving side of the semiconductor substrate, wherein the conductive paste comprises (i) a conductive powder, (ii) a glass frit, (iii) an organic polymer comprising an elastomer and (iv) an organic solvent; and firing the applied conductive paste.

Another aspect relates to a conductive paste comprising (i) a conductive powder, (ii) a glass frit, (iii) an organic polymer comprising an elastomer, and (iv) an organic solvent.

A fine line electrode can be formed by the present invention.

DETAILED DESCRIPTION OF THE INVENTION

A method of manufacturing a solar cell electrode is explained below.
(Description of Method of Manufacturing an Electrode)

The following shows an embodiment of manufacturing process of a p-base silicon type solar cell. However, the invention is not limited to the following embodiment.

Figure 1A:
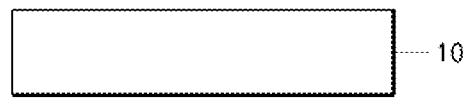
FIG. 1A to 1F are drawings for explaining a solar cell electrode manufacturing process.
Figure 1B:
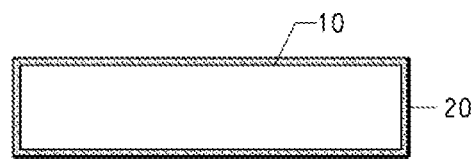

FIG. 1A shows a p-type silicon substrate 10. In FIG. 1B, an n-layer 20, of the reverse conductivity type is formed by the thermal diffusion of phosphorus (P) or the like. Phosphorus oxychloride ($POCl_3$) is commonly used as the phosphorus diffusion source. In the absence of any particular modification, n-layer 20 is formed over the entire surface of the silicon substrate 10. The silicon wafer consists of p-type substrate 10 and n-layer 20 which typically has a sheet resistivity on the order of several tens of ohms per square (ohm/□).

Figure 1C:
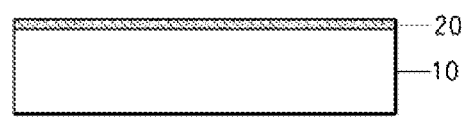

After protecting one surface of the n-layer with a resist or the like, the n-layer 20 is removed from most surfaces by etching so that it remains only on one main surface as shown in FIG. 1C. The resist is then removed using an organic solvent or the like.

Figure 1D:
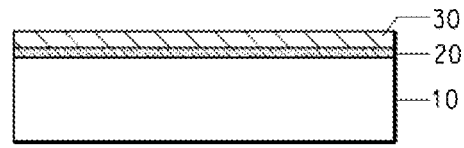

Next, a passivation layer 30 can be formed on the n-layer 20 as shown in FIG. 1D by a process such as plasma chemical vapor deposition (CVD). $SiN_x$, $TiO_2$, $Al_2O_3$, $SiO_x$ or ITO could be used as a material for a passivation layer. Most commonly used is $Si_3N_4$. The passivation layer is sometimes called anti-reflection layer, especially when it is formed on the front side that is the light receiving side of the semiconductor substrate.

Figure 1E:
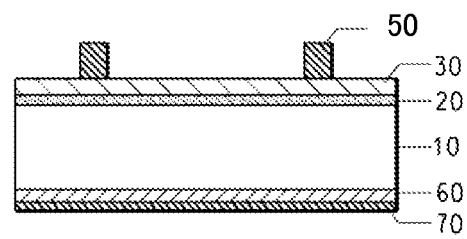

As shown in FIG. 1E, conductive paste, 50, for a front electrode is applied on the passivation layer, 30, formed on the silicon substrate, and is then dried. An aluminum paste, 60, and a silver paste, 70, are screen printed onto the back side of the substrate, 10, and successively dried. Viscosity of the conductive paste, 50, is 200 to 500 Pa·s measured by Brookfield HBT with a spindle #14 at 10 rpm in an embodiment. Adjusting the viscosity, solvent can be added to the paste to be preferable for applying on the substrate. In the event of screen printing, the viscosity of the conductive paste, 50, can be 250 to 400 Pa·s in another embodiment, 280 to 380 Pa·s in another embodiment.

Firing is then carried out in an infrared furnace at a peak temperature in a range of 450° C. to 1000° C. Firing total time from an entrance to an exit of the furnace can be from 30 seconds to 5 minutes. In an embodiment of the present invention, the firing profile can be 10 to 60 seconds at over 400° C. and 2 to 10 seconds at over 600° C. With such firing condition, a semiconductor substrate avoids damage from the heat.

Figure 1F:
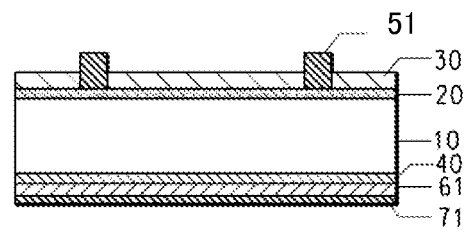

As shown in FIG. 1F, during firing, aluminum diffuses as an impurity from the aluminum paste into the silicon substrate, 10, on the back side, thereby forming a p+ layer, 40, containing a high aluminum dopant concentration. Firing converts the dried aluminum paste, 60, to an aluminum back electrode, 61. The backside silver paste, 70, is fired at the same time, becoming a silver back electrode, 71. During firing, the boundary between the backside aluminum and the backside silver assumes the state of an alloy, thereby achieving electrical connection. Most areas of the back electrode are occupied by the aluminum electrode, partly on account of the need to form a p+ layer, 40. At the same time, because soldering to an aluminum electrode is not easy, the silver paste, 70, is used to form a backside electrode, 71, on limited areas of the backside as an electrode for interconnecting solar cell cells by means of copper ribbon or the like.

On the front side, the front electrode, 51, is made of the conductive paste, 50, which is capable of fire through the passivation layer, 30, during firing to achieve electrical contact with the n-type layer, 20. The front electrode 51 can comprise at least finger lines and a bus bar. The present invention can be used to form at least the finger lines that are required to be narrow wide. The solar cell electrodes, especially the finger lines, have width of 10 to 60 μm in an embodiment, 20 to 45 μm in another embodiment, 30 to 58 μm in another embodiment, 15 to 38 μm in another embodiment, 20 to 34 μm in another embodiment.

Although a p-base type of solar cell is shown as an example, the invention can be used in an n-base type of solar cell, back contact type of solar cell, or any other type of solar cell using a conductive paste to form a solar cell electrode.

The invention can be used in an n-base silicon type of a solar cell or any other type of a solar cell using a conductive paste to form a fine line electrode in a solar cell, other than the p-base silicon type of a solar cell described above.

(Conductive Paste)

A conductive paste for manufacturing a solar cell electrode is explained in detail below. The conductive paste comprises (i) a conductive powder, (ii) a glass frit, (iii) an organic polymer comprising an elastomer and (iv) an organic solvent.

(i) Conductive Powder

A conductive powder is a metal powder provided to transport electrical current in an electrode.

In an embodiment, a conductive powder is a metal powder with an electrical conductivity $1.00 \times 10^7$ Siemens (S)/m or more at 293 Kelvin. Such conductive metals comprise, for example, iron (Fe; $1.00 \times 10^7$ S/m), aluminum (Al; $3.64 \times 10^7$ S/m), nickel (Ni; $1.45 \times 10^7$ S/m), copper (Cu; $5.81 \times 10^7$ S/m), silver (Ag; $6.17 \times 10^7$ S/m), gold (Au; $4.17 \times 10^7$ S/m), molybdenum (Mo; $2.10 \times 10^7$ S/m), magnesium (Mg; $2.30 \times 10^7$ S/m), tungsten (W; $1.82 \times 10^7$ S/m), cobalt (Co; $1.46 \times 10^7$ S/m) and zinc (Zn; $1.64 \times 10^7$ S/m).

In another embodiment, a conductive powder can be a metal powder with an electrical conductivity $3.00 \times 10^7$ S/m or more at 293 Kelvin. In this case, the conductive powder can comprise one or more metal powder(s) selected from the group consisting of Al, Cu, Ag and Au. In another embodiment, the conductive powder can comprise Ag powder, Al powder or a mixture thereof. In an embodiment, the conductive powder can comprise Ag powder. Using such conductive metal powders with high electrical conductivity, the electrical property of an electrode can be improved.

In an embodiment, a conductive powder is flaky or spherical in shape.

There is no special restriction on the particle diameter of the conductive powder from the viewpoint of technological effectiveness when used as typical electrically conducting paste. In an embodiment, however, particle diameter of the conductive powder can be 0.1 to 10 μm, in another embodiment 0.5 to 5 μm, in another embodiment 1.0 to 3 μm. With such particle diameter, the conductive powder can be sintered well. For example, large particles can be sintered more slowly than small particles. Furthermore, it can be also necessary that the particle diameter can be appropriate for a method used to apply the conductive paste onto a semiconductor substrate, for example, screen printing. In an embodiment, it is possible to mix two or more types of conductive powder of different diameters.

The particle diameter (D50) is obtained by measuring the distribution of the particle diameters by using a laser diffraction scattering method and can be defined as D50. Microtrac model X-100 is an example of the commercially-available devices.

In an embodiment, the conductive powder is of ordinary high purity (99%). However, depending on the electrical requirements of the electrode pattern, less pure silver can also be used.

There are no special restrictions on the content of the conductive powder in the conductive paste, however, in an embodiment, the conductive powder is 40 weight percent (wt %) or more, in another embodiment 60 wt % or more, in another embodiment 75 wt % or more based on the total weight of the conductive paste, in view of conductivity. For the maximum content, in an embodiment, the conductive powder can be 95 wt % or less, in another embodiment, 92 wt % or less, in another embodiment, 90 wt % or less based on the weight of the conductive paste, in view of the powder's dispersity.

(ii) Glass Frit

A conductive paste contains a glass frit as an inorganic binder. When firing a conductive paste, a glass frit melts to promote sintering the conductive powder, and adhere to a substrate.

In an embodiment, the softening point of a glass frit can be 390 to 600° C., in another embodiment 400 to 550° C., in another embodiment, 410 to 460° C. When the softening point is in this range, glass frit can melt properly to obtain the effects mentioned above. Here, the "softening point" is the softening point obtained by the fiber elongation method of ASTM C338-57.

The chemical composition of a glass frit here is not limited. Any glass frit suitable for use in electrically conducting pastes for electronic materials is acceptable. For example, a lead borosilicate glass can be used. Lead silicate and lead borosilicate glasses can be excellent from a viewpoint of both softening point and glass fusion characteristics. In addition, zinc borosilicate or lead-free glasses can be also used. In an embodiment, a lead tellurium containing glass can be used.

The glass frit can be 0.5 to 8 wt % in an embodiment, 0.8 to 6 wt % in another embodiment, 1 to 3 wt % in another embodiment, based on the weight of the conductive paste. With such amount of glass frit, sintering a conductive powder and adhesion between an electrode and a substrate can be sufficient.

(iii) Organic Polymer

The organic polymer comprises an elastomer. The elastomer is a polymer having elasticity.

The elastomer can be thermosetting or thermoplastic in an embodiment. The elastomer is thermoplastic in an embodiment.

In an embodiment, the elastomer can be selected from the group consisting of acrylic elastomer, ethylene acrylic elastomer, polyisoprene elastomer, styrene elastomer, styrene-butadiene elastomer, polyester elastomer, butadiene elastomer, polyisobutylene elastomer, polyisobutylene-isoprene elastomer, nitrile-butadiene elastomer, polynitrile elastomer, ethylene-propylene elastomer, ethylene propylene diene elastomer, polyurethane-polyether block elastomer, polyamide-polyether block copolymer, siloxane elastomers, ethylene-propylene elastomer, isoprene elastomer, nitrile elastomer, natural elastomer, poly(ethylene-co-methyl acrylate) elastomer and a mixture thereof.

The elastomer can be ethylene acrylic elastomer in an embodiment. The ethylene acrylic elastomer is for example a copolymer of ethylene and acrylic acid or a copolymer of ethylene and acrylic acid ester that are further polymerized with a monomer with cross-linkable group.

The elastomer has glass transition temperature of −5 to −50° C. in an embodiment −10 to −45° C. in another embodiment, −20 to −40° C. in another embodiment.

Mooney viscosity ($ML_{1+4}$) at 100° C. of the elastomer is 10 to 50 in an embodiment, 12 to 35 in another embodiment, 13 to 30 in another embodiment, 15 to 25 in another embodiment.

The elastomer is commercially available from E.I. du Pont de Nemours and Company of Wilmington, Del., U.S.A. under the DuPont™ Vamac® brand. Examples of DuPont™ Vamac® brand include G, GLS, GXF, DP, Ultra IP, Ultra LS, Ultra HT, Ultra HT-OR.

The elastomer is 5 to 100 wt % in an embodiment, 6 to 90 wt % in another embodiment, 8 to 80 wt % in another embodiment, 10 to 70 wt % in another embodiment, 11 to 60 wt % in another embodiment, 12 to 55 wt % in another embodiment, 13 to 25 wt % in another embodiment, 40 to 60 wt % in another embodiment, based on the weight of the organic polymer.

The elastomer is 0.01 to 5.0 wt % in an embodiment, 0.08 to 3.0 wt % in another embodiment, 0.1 to 2.0 wt % in another embodiment, based on the weight of the conductive paste.

The organic polymer can additionally comprise any other polymer. The organic polymer can additionally comprise ester of hydrogenated rosin, epoxy resin, polyester resin, ethylene-vinyl acetate copolymer, ethyl cellulose or a mixture thereof.

The organic polymer is 0.01 to 5.0 wt % in an embodiment, 0.02 to 2.5 wt % in another embodiment, 0.08 to 2.0 wt %, based on the weight of the conductive paste.

The organic polymer can be burned off during the firing step. However, a small amount of residue can be allowable as long as does not degrade the electrical and physical property as the electrode.

(iv) Organic Solvent

An organic solvent can be any liquid that dissolves the organic polymer.

In an embodiment, the organic solvent can be selected from the group consisting of butyl carbitol acetate, terpineol and a mixture thereof.

The organic solvent can be 3.0 to 13.0 wt % in an embodiment, 4.0 to 11.0 wt % in another embodiment, 5.0 to 9.0 wt % in another embodiment, based on the weight of the conductive paste. With such amount of organic solvent, a conductive paste can obtain sufficient viscosity for printability.

(v) Additives

Thickener, stabilizer, viscosity modifier or surfactant as additives can be added to the disclosed conductive paste. Other common additives such as a dispersant, viscosity-adjusting agent, and so on can also be added. The amount of the additive depends on the desired characteristics of the resulting electrically conducting paste. The additives can also be added in multiple types.

EXAMPLES

The present invention is illustrated by, but is not limited to, the following examples.

Example 1 and Comparative Example 1

The conductive paste was produced using the following materials. The weight percent (wt %) herein means weight percent based on the total weight of the conductive paste.

Conductive powder: 88.9 wt % of a spherical silver powder. The particle diameter (D50) was 2 μm.
Glass frit: 1.8 wt % of Pb—Te—Li—Cr glass frit with the softening point of 380-400° C.
Organic polymer: Ethylene acrylic elastomer (Vamac® G, E. I. du Pont de Nemours and Company) or ethyl cellulose. The amounts are shown in Table 1.
Organic solvent: 7 wt % mixture of Texanol, DBE-3, butyl carbitol acetate, Butyl carbitol as an organic solvent.
Additive: a stabilizer, a viscosity modifier, a surfactant. The amount of viscosity modifier was adjusted as shown in Table 1 to make the conductive paste viscosity 300 Pa·s as measured by Brookfield HBT viscometer.

The conductive paste was prepared with the following procedure. The organic polymer and the solvent were mixed in a mixing can for 2 hours at 80° C. The Ag powder and the glass frit were added to the mixture of the organic resin and solvent and mixed for another 15 minutes to form a conductive paste. When well mixed, the conductive paste was repeatedly passed through a 3-roll mill at progressively increasing pressures from 0 to 400 psi. The degree of dispersion was measured by fineness of grind (FOG). A typical FOG value was adjusted to 20/10 or less.

The conductive paste obtained above was screen printed onto a $SiN_x$ layer formed on a silicon semiconductor substrate (152 mm×152 mm) through a screen mask. The screen mask had a line pattern of 20 finger lines with 30 μm wide openings and 2 bus bars with 1.5 mm wide openings on a 15 μm emulsion in a screen with 360 mesh and 16 μm wires.

The printed conductive paste was dried at 150° C. for 5 minutes.

The dried conductive paste was fired in an IR heating type of a belt furnace (CF-7210B, Despatch industry) at peak temperature setting with 945° C. Firing time from furnace entrance to exit was 78 seconds. The belt speed of the furnace was 550 cpm. The fired conductive paste cooled down to form an electrode.

Width of the screen printed conductive paste and the electrode were respectively measured with a optical microscope, micro image checker, Model A200 from Panasonic corporation. The width was a mean value of measured widths at 52 point with intervals of about 50 μm on the electrode upper surface.

The width of the printed line pattern and electrode were just 34.5 μm and 32.8 μm respectively in Example 1 where the conductive paste contains ethylene acrylic elastomer while they were 42.5 μm and 40 μm in Comparative Example 1 where ethyl cellulose was used as a polymer but still keep the similar electrode thickness.

TABLE 1

| | Comparative Example 1 | Example 1 (wt%) |
|---|---|---|
| Ag powder | 89.9 | 88.9 |
| Glass frit | 1.8 | 1.8 |
| Polymer | | |
| Ethyl cellulose | 0.12 | 0 |
| Ethylene acrylic elastomer | 0 | 0.2 |
| Solvent | 7 | 7 |
| Additive | 2.18 | 2.1 |
| Printed pattern width (μm) | 42.5 | 34.3 |
| Electrode width (μm) | 40.0 | 32.8 |
| Electrode thickness (μm) | 7.3 | 7.8 |

Example 2 to 4 and Comparative Example 2

The amount of the ethylene acrylic elastomer was examined.

The electrodes were formed in the same manner as Example 1 except for the compositions as shown in Table 2 and the finger lines with 45 μm wide openings of the screen mask. The width of the printed line pattern and electrode measured with the same way above are shown in Table 2. The width of the printed line pattern and electrode in Example 2 to 4 were narrower than that in Comparative (Com.) Example 2.

TABLE 2

| | Com. Example 2 | Example 2 | Example 3 | Example 4 |
|---|---|---|---|---|
| | | | | (wt%) |
| Ag powder | 89 | 89 | 89 | 89 |
| Glass frit | 2 | 2 | 2 | 2 |
| Ethyl cellulose resin | 0.13 | 0 | 0 | 0 |
| Ethylene acrylic elastomer | 0 | 0.1 | 0.15 | 0.2 |
| Ester of hydrogenated rosin | 0.9 | 0.9 | 0.9 | 0.9 |
| Solvent | 7 | 6 | 6 | 6 |
| Additive | 0.7 | 1.1 | 1.1 | 1.1 |
| Metal oxide powder | 0.07 | 0.07 | 0.07 | 0.07 |
| Printed pattern width (μm) | 67 | 61 | 59 | 56 |
| Electrode width (μm) | 58.5 | 55 | 53 | 50 |
| Electrode thickness (μm) | 16 | 15 | 13 | 14 |

Example 5 and Comparative Example 3

The electrodes were formed in the same manner as Example 1 except for the compositions as shown in Table 2.

The prepared pastes were screen printed on multicrystalline wafers subjected to the IR drying process at 150° C. for 10 minutes through the furnace. The dried patterns were then fired as well as Example 1.

Line dimensions were determined with a LaserTec H1200 Confocal microscope before and after firing, "printed pattern width" and "electrode width" respectively. A step and repeat program was used to obtain 30 average measurements of printed finger dimensions across the area of the 6" square wafers. An overall average was calculated from the 30 individual measurements to obtain an average line dimension for that particular test condition. Line dimensions were obtained on as-printed wafers, after the IR drying step, and after the firing step.

Efficiency (Eff, %) was also measured. An aluminium paste (PV381, E. I. du Pont de Nemours and Company) and a silver paste as a tabbing (PV502, E. I. du Pont de Nemours and Company) were applied on the rear surface. Solar cells were measured electrically under 1 sun conditions. The formed solar cells were placed in a Berger Photovoltaic Cell Tester for measuring efficiencies. The Xe Arc lamp in the PV cell tester simulated the sunlight with a known intensity and radiated the front surface of the cell. The tester used a four contact method to measure current (I) and voltage (V) at approximately 400 load resistance settings to determine the cell's I-V curve. Efficiency (Eff) was calculated from the I-V curve.

Referring to Table 3, the line dimensions indicate reduced finger width for Example 5 with similar height. Efficiency was improved in Example 5 compared to Comparative Example 3.

TABLE 3

| | Comparative Example 3 | Example 5 |
|---|---|---|
| | | (wt%) |
| Ag powder | 88.8 | 88.8 |
| Glass frit | 1.8 | 1.8 |
| Ethyl cellulose resin | 0.13 | 0 |
| Ethylene acrylic elastomer | 0 | 0.16 |
| Ester of hydrogenated rosin | 0.9 | 0.9 |
| Solvent | 8.2 | 7.5 |

TABLE 3-continued

| | Comparative Example 3 | Example 5 |
|---|---|---|
| | | (wt%) |
| Additive | 0.75 | 0.8 |
| Metal oxide powder | 0.07 | 0.07 |
| Printed pattern width (μm) | 59.5 | 54.1 |
| Electrode width (μm) | 57.7 | 51.3 |
| Electrode thickness (μm) | 14.2 | 14.7 |
| Efficiency (%) | 17.06 | 17.13 |

What is claimed is:

1. A method of manufacturing a fine line solar cell electrode comprising steps of:
   preparing a semiconductor substrate,
   applying a conductive paste onto the light receiving side of the semiconductor substrate, wherein the conductive paste comprises (i) a conductive powder, (ii) a glass frit, (iii) an organic polymer comprising an elastomer and (iv) an organic solvent, wherein the elastomer is thermoplastic, wherein the elastomer is selected from the group consisting of acrylic elastomer, ethylene acrylic elastomer, polyisoprene elastomer, styrene elastomer, polyester elastomer, butadiene elastomer, polyisobutylene elastomer, polyisobutylene-isoprene elastomer, nitrile-butadiene elastomer, polynitrile elastomer, ethylene-propylene elastomer, ethylene propylene diene elastomer, polyurethane-polyether block elastomer, polyamide-polyether block copolymer, siloxane elastomers, ethylene-propylene elastomer, isoprene elastomer, nitrile elastomer, natural elastomer, poly(ethylene-co-methyl acrylate) elastomer and a mixture of said elastomers, wherein the elastomer is 6 to 90 wt % based on the weight of the organic polymer; and
   firing the applied conductive paste to form the fine line solar cell electrode with a width of 10 to 60 μm.

2. The method of claim 1, wherein the elastomer has glass transition temperature of −5 to −50° C.

3. The method of claim 1, wherein mooney viscosity ($ML_{1+4}$) at 100° C. of the elastomer is 10 to 50.

4. The method of claim 1, wherein the organic polymer is 0.01 to 5.0 wt %, based on the weight of the conductive paste.

5. The method of claim 1, wherein the conductive powder is 40 to 95 wt % and the glass frit is 0.5 to 8 wt %, based on the weight of the conductive paste.

6. The method of claim 1, wherein the elastomer is a copolymer of ethylene and acrylic acid or a copolymer of ethylene and acrylic acid ester that are further polymerized with a monomer with a cross-linkable group.

7. The method of claim 1, wherein the fine line solar cell electrode has a width of 20 to 45 μm.

8. The method of claim 1, wherein the organic polymer further comprises one or more of an ester of hydrogenated rosin, an epoxy resin, a polyester resin, an ethylene-vinyl acetate copolymer, an ethyl cellulose, or a mixture thereof.

9. The method of claim 1, wherein the viscosity of the conductive paste is 200 to 500 Pa·s.

10. A conductive paste comprising (i) a conductive powder, (ii) a glass frit, (iii) an organic polymer comprising elastomer and (iv) an organic solvent, wherein the elastomer is thermoplastic, wherein the elastomer is selected from the group consisting of acrylic elastomer, ethylene acrylic elastomer, polyisoprene elastomer, styrene elastomer, polyester elastomer, butadiene elastomer, polyisobutylene elastomer, polyisobutylene-isoprene elastomer, nitrile-butadiene elastomer, polynitrile elastomer, ethylene-propylene elastomer, ethylene propylene diene elastomer, polyurethane-polyether block elastomer, polyamide-polyether block copolymer, siloxane elastomers, ethylene-propylene elastomer, isoprene elastomer, nitrile elastomer, natural elastomer, poly(ethylene-co-methyl acrylate) elastomer and a mixture of said elastomers, wherein the elastomer is 6 to 90 wt % based on the weight of the organic polymer and the conductive paste is capable of being formed into a fine line solar cell electrode with a width of 10 to 60 μm.

11. The method of claim 1, wherein the applying of the conductive paste comprises screen printing.

12. The method of claim 1, wherein the elastomer is an ethylene acrylic elastomer.

13. The conductive paste of claim 10, wherein the elastomer is an ethylene acrylic elastomer.

14. The conductive paste of claim 10, wherein the elastomer is a copolymer of ethylene and acrylic acid or a copolymer of ethylene and acrylic acid ester that are further polymerized with a monomer with a cross-linkable group.

15. The conductive paste of claim 10, wherein the conductive powder is 40 to 95 wt %, the glass frit is 0.5 to 8 wt %, the organic polymer is 0.01 to 5.0 wt %, the organic solvent is 3.0 to 13.0 wt %, based on the weight of the conductive paste.

16. The conductive paste of claim 10, wherein the elastomer has a glass transition temperature of −5 to −50° C.

17. The conductive paste of claim 10, wherein mooney viscosity ($ML_{1+4}$) at 100° C. of the elastomer is 10 to 50.

18. The conductive paste of claim 10, wherein the organic polymer further comprises one or more of an ester of hydrogenated rosin, an epoxy resin, a polyester resin, an ethylene-vinyl acetate copolymer, an ethyl cellulose, or a mixture thereof.

19. The conductive paste of claim 10, wherein the viscosity of the conductive paste is 200 to 500 Pa·s.

* * * * *